United States Patent
Takagi et al.

(10) Patent No.: US 9,559,132 B2
(45) Date of Patent: Jan. 31, 2017

(54) SOLID-STATE IMAGE CAPTURE DEVICE

(71) Applicant: HAMAMATSU PHOTONICS K.K., Hamamatsu-shi, Shizuoka (JP)

(72) Inventors: Shin-ichiro Takagi, Hamamatsu (JP); Yasuhito Yoneta, Hamamatsu (JP); Kenichi Sugimoto, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/407,662

(22) PCT Filed: Mar. 1, 2013

(86) PCT No.: PCT/JP2013/055705
§ 371 (c)(1),
(2) Date: Dec. 12, 2014

(87) PCT Pub. No.: WO2013/190864
PCT Pub. Date: Dec. 27, 2013

(65) Prior Publication Data
US 2015/0155314 A1  Jun. 4, 2015

(30) Foreign Application Priority Data

Jun. 18, 2012  (JP) .................. 2012-137110

(51) Int. Cl.
*H01L 27/146* (2006.01)
*H01L 27/148* (2006.01)
(Continued)

(52) U.S. Cl.
CPC ....... *H01L 27/1462* (2013.01); *H01L 27/1461* (2013.01); *H01L 27/14629* (2013.01);
(Continued)

(58) Field of Classification Search
None
See application file for complete search history.

(56) References Cited

U.S. PATENT DOCUMENTS

| | | | |
|---|---|---|---|
| 2001/0042864 A1* | 11/2001 | Kato | ................. H01L 27/14609 257/79 |
| 2005/0040440 A1* | 2/2005 | Murakami | .......... H01L 27/1462 257/225 |
| 2012/0038016 A1* | 2/2012 | Suzuki et al. | ................ 257/443 |

FOREIGN PATENT DOCUMENTS

| | | |
|---|---|---|
| CN | 1585134 | 2/2005 |
| CN | 102365741 | 2/2012 |

(Continued)

OTHER PUBLICATIONS

English-language translation of International Preliminary Report on Patentability (IPRP) dated Dec. 31, 2014 that issued in WO Patent Application No. PCT/JP2013/055705.

*Primary Examiner* — Khaja Ahmad
(74) *Attorney, Agent, or Firm* — Drinker Biddle & Reath LLP

(57) ABSTRACT

A semiconductor substrate is provided with a plurality of photosensitive regions on a first principal surface side. An insulating film has a third principal surface and a fourth principal surface opposed to each other, and is arranged on the semiconductor substrate so that the third principal surface is opposed to the first principal surface. A cross section parallel to a thickness direction of the semiconductor substrate, of a region corresponding to each photosensitive region in the first principal surface is a corrugated shape in which concave curves and convex curves are alternately continuous. A cross section parallel to a thickness direction of the insulating film, of a region corresponding to each photosensitive region in the third principal surface is a corrugated shape in which concave curves and convex (Continued)

curves are alternately continuous corresponding to the first principal surface. The fourth principal surface is flat.

4 Claims, 21 Drawing Sheets

(51) Int. Cl.
  *H01L 31/0236* (2006.01)
  *H01L 31/0352* (2006.01)
(52) U.S. Cl.
  CPC .. *H01L 27/14806* (2013.01); *H01L 31/02363* (2013.01); *H01L 31/03529* (2013.01); *H01L 27/14843* (2013.01)

(56) References Cited

FOREIGN PATENT DOCUMENTS

| EP | 2 413 362 | 2/2012 |
|----|-----------|--------|
| JP | H06-244444 A | 9/1994 |
| JP | 2005-072097 A | 3/2005 |
| JP | 2008-135564 | 6/2008 |
| JP | 2009-302319 A | 12/2009 |
| JP | 2010-067736 | 3/2010 |
| JP | 2011-124522 A | 6/2011 |
| WO | WO 2010110317 A1 * | 9/2010 |
| WO | WO-2011/024577 A1 | 3/2011 |

* cited by examiner (a)

(b)

(a)

(b)

(a)

(b)

(a)

(b)

(a)

(b)

SOLID-STATE IMAGE CAPTURE DEVICE

TECHNICAL FIELD

The present invention relates to a solid-state imaging device.

BACKGROUND ART

There is a known solid-state imaging device comprising: a semiconductor substrate having a first principal surface and a second principal surface opposed to each other and provided with a plurality of photosensitive regions on the first principal surface side; and an insulating film having a third principal surface and a fourth principal surface opposed to each other and arranged on the semiconductor substrate so that the third principal surface is opposed to the first principal surface (e.g., cf. Patent Literature 1). In the solid-state imaging device described in Patent Literature 1, the first principal surface of the semiconductor substrate has an uneven surface in a region corresponding to the photosensitive regions and the third principal surface of the insulating film has an uneven surface corresponding to the uneven surface of the first principal surface, in a region corresponding to the photosensitive regions.

CITATION LIST

Patent Literature

Patent Literature 1: Japanese Patent Application Laid-Open Publication No. 2011-124522

SUMMARY OF INVENTION

Technical Problem

It is an object of the present invention to provide a solid-state imaging device capable of reducing variation in sensitivity and stabilizing the sensitivity.

Solution to Problem

The Inventors conducted investigation and research and discovered the new fact as described below.

It is difficult to form the insulating film in even thickness across a plurality of photosensitive regions, because of various factors in a manufacturing process of the solid-state imaging device. Namely, there is a possibility that the thickness of the insulating film can differ among the photosensitive regions. The difference in the thickness of the insulating film among the photosensitive regions leads to difference in transmittance in the insulating film among the photosensitive regions for light incident to the solid-state imaging device, so as to cause variation in sensitivity. Depending upon the thickness of the insulating film, it results in increasing influence of interference between light incident into the solid-state imaging device (the insulating film) and light reflected on the surface of the semiconductor substrate. With increase of influence of light interference, undulation of sensitivity characteristic will become larger and it will be difficult to stabilize the sensitivity.

First, the Inventors conducted elaborate research on configurations capable of reducing the variation in sensitivity and stabilizing the sensitivity.

As a consequence of the research, the Inventors came to consider that reduction of variation in sensitivity and stabilization of sensitivity could be achieved by adoption of a following configuration. A first principal surface of a semiconductor substrate (a light incidence surface of the semiconductor substrate) has an uneven surface in a region corresponding to each photosensitive region, a third principal surface of an insulating film (a surface opposed to the first principal surface) has an uneven surface corresponding to the uneven surface of the first principal surface, and a fourth principal surface of the insulating film is flat. This arises from the following: the thickness of the insulating film varies corresponding to the shape of the uneven surface in the region corresponding to each photosensitive region, thereby to absorb and suppress influence of thickness variation in the whole of the insulating film.

The Inventors also found that a new problem would arise, depending upon the shape of the uneven surface. The insulating film also functions as an antireflection film and a wavelength characteristic of reflectance thereof varies, depending upon the shape of the uneven surface. When the uneven surface consists of first flat faces located in deepest portions, second flat faces located in top portions, and slant faces connecting the first flat faces and the second flat faces (or when the height (depth) of the uneven surface varies stepwise), the reflectance for light at a predetermined wavelength is reduced by setting a height of a level difference made between the first flat faces and the second flat faces to a desired value. Therefore, when light of a wavelength different from the predetermined wavelength is incident, it is difficult to achieve the reduction effect of reflectance.

It is possible to achieve the reduction effect of reflectance if the light of the wavelength different from the predetermined wavelength is made incident at a predetermined position on the slant face. However, since regions where the slant faces are formed are limited, the reduction effect of reflectance is extremely limited.

Then, the Inventors conducted further elaborate research on configurations capable of reducing the variation in wavelength characteristic of reflectance, and have accomplished the present invention. Namely, by adopting a configuration wherein the height (depth) of the uneven surface does not vary stepwise but varies in a continuous manner, reflections on the first principal surface of the semiconductor substrate equally cancel out each other for light in a wide wavelength range, so as to enable reduction of the variation in wavelength characteristic of reflectance.

The present invention is a solid-state imaging device comprising: a semiconductor substrate having a first principal surface and a second principal surface opposed to each other, and provided with a plurality of photosensitive regions on the first principal surface side; and an insulating film having a third principal surface and a fourth principal surface opposed to each other, and arranged on the semiconductor substrate so that the third principal surface is opposed to the first principal surface; a cross section parallel to a thickness direction of the semiconductor substrate, of a region corresponding to each photosensitive region in the first principal surface of the semiconductor substrate being a corrugated shape in which concave curves and convex curves are alternately continuous; a cross section parallel to a thickness direction of the insulating film, of a region corresponding to each photosensitive region in the third principal surface of the insulating film being a corrugated shape in which concave curves and convex curves are alternately continuous corresponding to the first principal surface; the fourth principal surface of the insulating film being flat.

In the present invention, the fourth principal surface of the insulating film is flat, while the cross section parallel to the thickness direction of the insulating film, of the region corresponding to each photosensitive region in the third principal surface of the insulating film is the corrugated shape in which concave curves and convex curves are alternately continuous corresponding to the first principal surface.

Therefore, the thickness of the insulating film varies corresponding to the shape of the third principal surface of the insulating film, in the region corresponding to each photosensitive region. This absorbs and suppresses the influence of thickness variation in the whole of the insulating film, so as to enable the reduction of the variation in sensitivity and stabilization of sensitivity.

In the present invention, the cross section parallel to the thickness direction of the semiconductor substrate, of the region corresponding to each photosensitive region in the first principal surface of the semiconductor substrate, is the corrugated shape in which concave curves and convex curves are alternately continuous. For this reason, the height (depth) of the first principal surface of the corrugated shape continuously varies across the entire region corresponding to each photosensitive region in the first principal surface. Therefore, the variation in wavelength characteristic of reflectance can be reduced in a wide wavelength range.

The insulating film may be arranged through an oxide film on the semiconductor substrate. On the semiconductor substrate, a plurality of semiconductor regions having a conductivity type different from that of the semiconductor substrate may be arranged on the first principal surface side, and each photosensitive region may be comprised of a pn junction formed of the semiconductor substrate and the semiconductor region.

Advantageous Effect of Invention

The present invention provides the solid-state imaging device capable of reducing the variation in sensitivity and stabilizing the sensitivity.

DESCRIPTION OF EMBODIMENTS

The preferred embodiments of the present invention will be described below in detail with reference to the accompanying drawings. In the description the same elements or elements with the same functionality will be denoted by the same reference signs, without redundant description.

Figure 1:
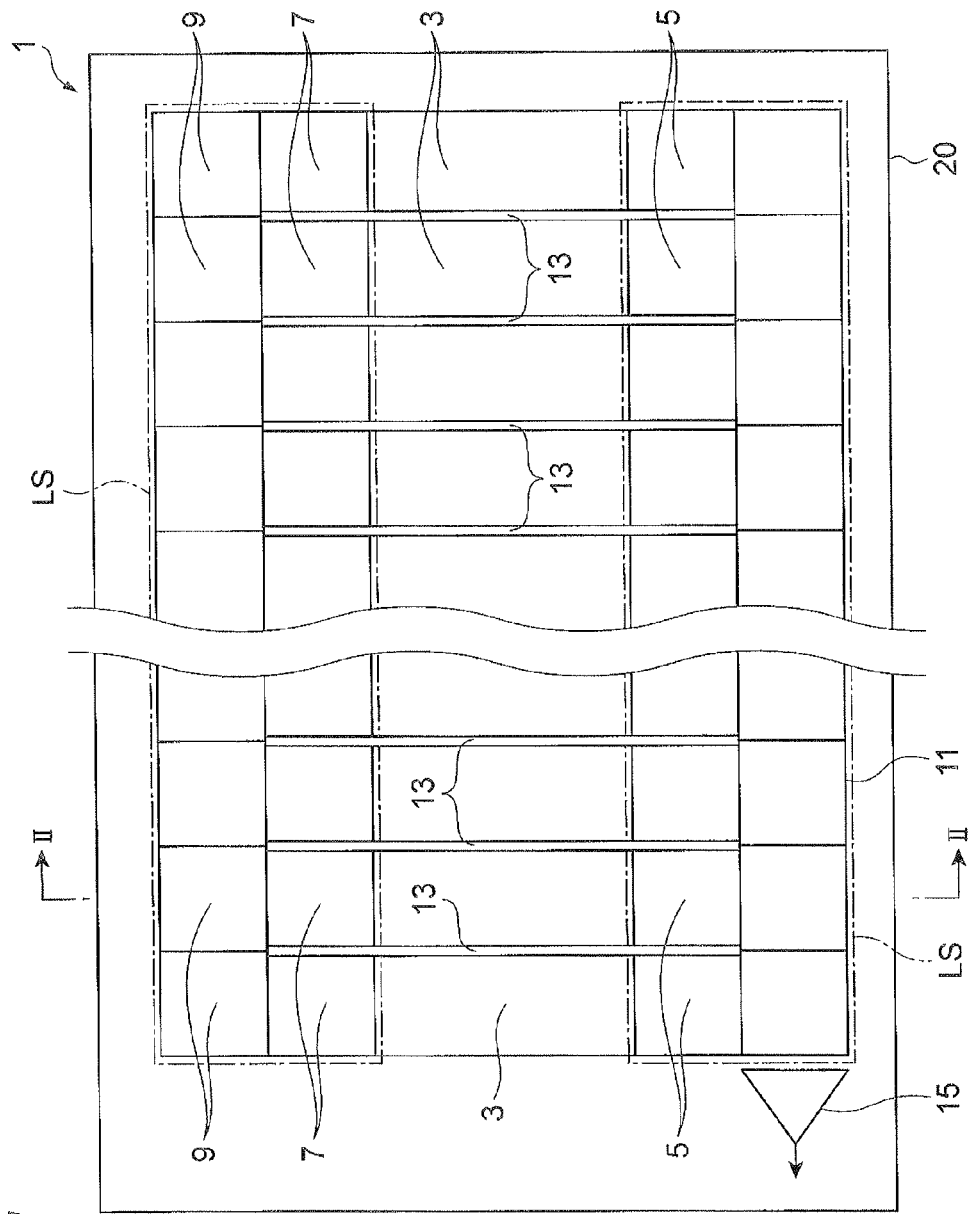
FIG. 1 is a drawing showing a configuration of a solid-state imaging device according to an embodiment of the present invention.
Figure 2:
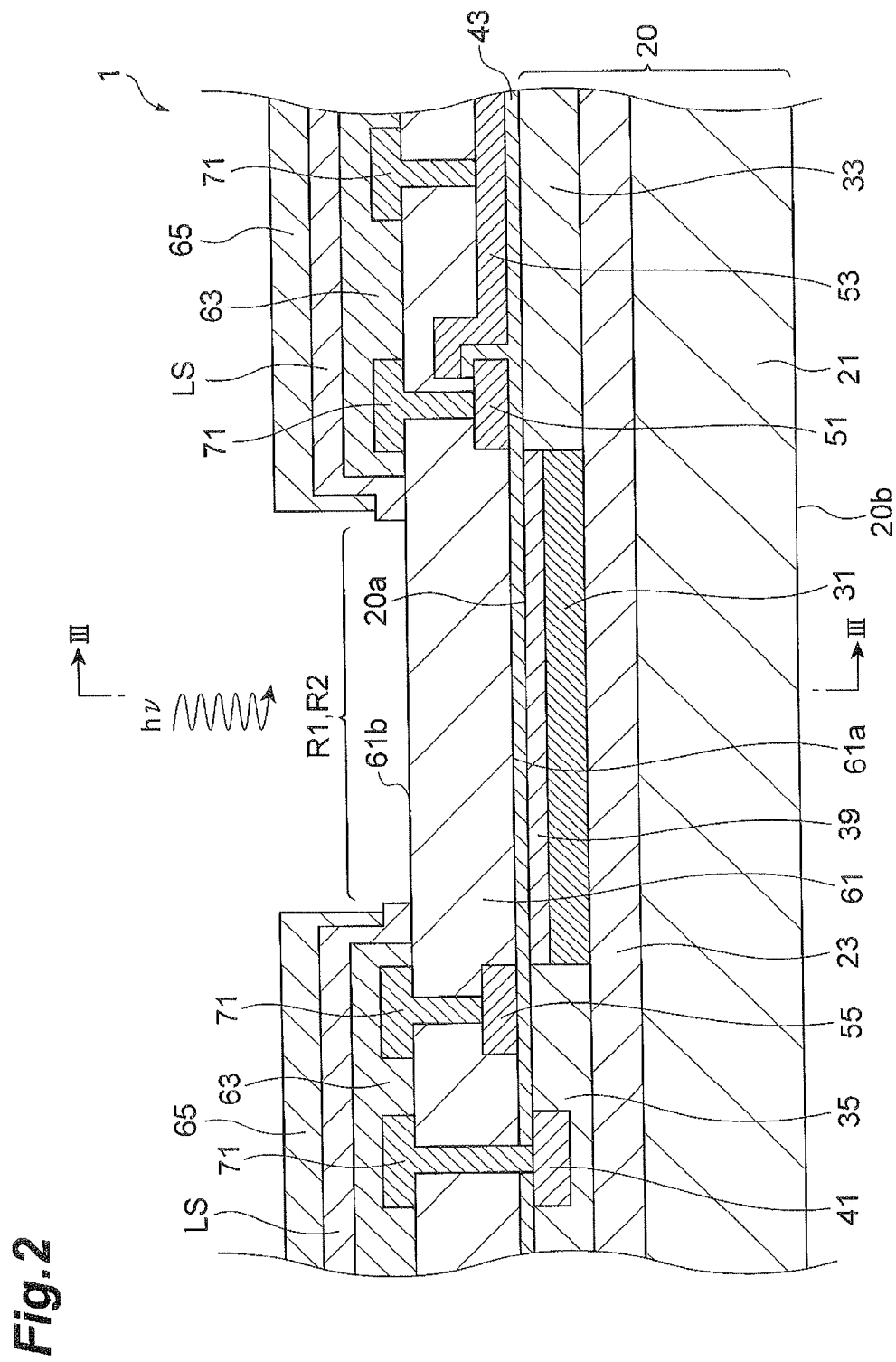
FIG. 2 is a drawing for explaining a cross-sectional configuration along the line in FIG. 1.
Figure 3:
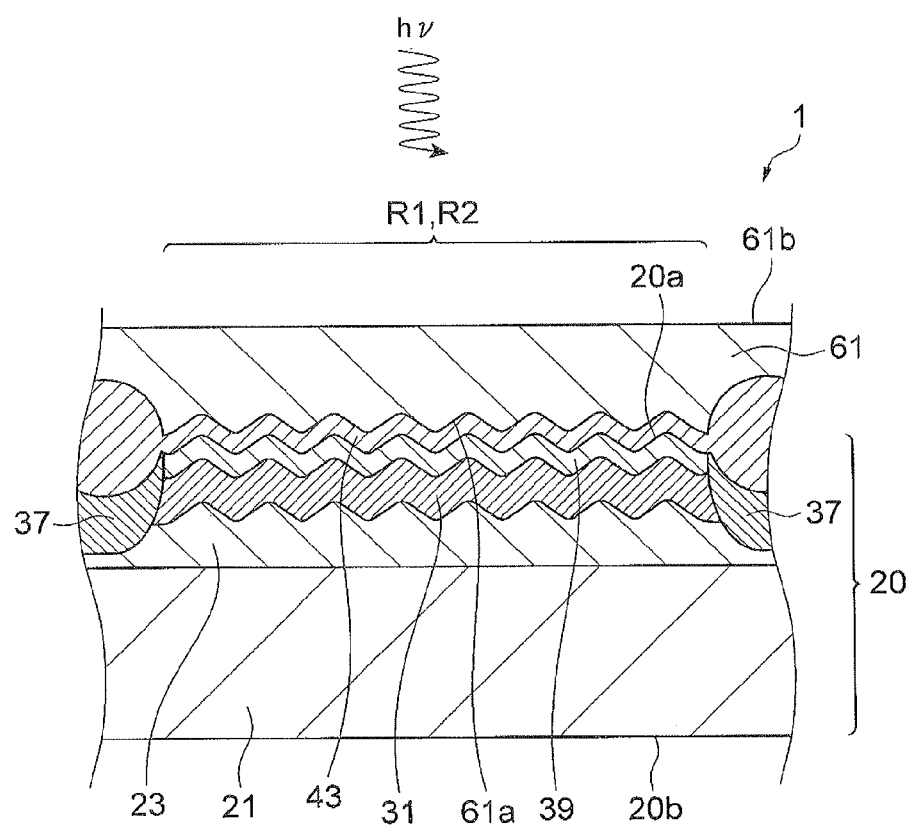
FIG. 3 is a drawing for explaining a cross-sectional configuration along the line in FIG. 2.

First, a configuration of a solid-state imaging device according to an embodiment of the present invention will be described with reference to FIGS. 1 to 3. FIG. 1 is a drawing showing the configuration of the solid-state imaging device according to the present embodiment. FIG. 2 is a drawing for explaining a cross-sectional configuration along the line II-II in FIG. 1. FIG. 3 is a drawing for explaining a cross-sectional configuration along the line III-III in FIG. 2.

The solid-state imaging device 1, as shown in FIG. 1, is provided with a plurality of photosensitive regions 3, a plurality of transfer gate portions 5, a plurality of anti-blooming gate portions 7, a plurality of anti-blooming drain portions 9, and a shift register portion 11. The solid-state imaging device 1 of the present embodiment is a front-illuminated IL (Interline transfer)-CCD image sensor, in which each one of the photosensitive regions 3 constitutes one pixel.

Each photosensitive region 3 senses incidence of light to generate an electric charge depending upon the intensity of the incident light. Namely, the photosensitive region 3 functions as a photoelectric conversion portion. In the present embodiment, the planar shape of the photosensitive region 3 is an approximately rectangular shape composed of two long sides and two short sides. The plurality of photosensitive regions 3 are juxtaposed so as to be arranged along a second direction (direction along the short-side direction of the photosensitive region 3) intersecting with a first direction along the long-side direction of the photosensitive region 3. Namely, the plurality of photosensitive regions 3 are arranged in an array form in the one-dimensional direction (the foregoing second direction). The shape of the photosensitive region 3 does not have to be limited to the above-described approximately rectangular shape.

For each photosensitive region 3, isolation regions 13 are arranged so as to interpose the photosensitive region 3 in between in the direction along the short-side direction of the photosensitive region 3.

The isolation regions 13 extend in the direction along the long-side direction of the photosensitive region 3, while adjoining the long sides of the photosensitive region 3. The isolation region 13 electrically isolates a pair of photosensitive regions 3 adjoining with the isolation region 13 in between.

The transfer gate portions 5 are arranged corresponding to the respective photosensitive regions 3 and on the side where one short side forming the planar shape of the photosensitive region 3 is located. Namely, the plurality of transfer gate portions 5 are juxtaposed in the aforementioned second direction on the side of one short side forming the planar shape of photosensitive region 3. Each transfer gate portion 5 acquires an electric charge generated in the photosensitive region 3 and transfers the acquired charge as signal charge in the first direction. The isolation region 13 is arranged between adjacent transfer gate portions 5 to implement electrical isolation between the transfer gate portions 5.

The anti-blooming gate portions 7 are arranged corresponding to the respective photosensitive regions 3 and on the side where the other short side forming the planar shape of the photosensitive region 3 is located. Namely, the plurality of anti-blooming gate portions 7 are juxtaposed in the second direction on the side of the other short side forming the planar shape of photosensitive region 3. Each anti-blooming gate portion 7 acquires an electric charge generated in the photosensitive region 3 and transfers the acquired charge as unnecessary charge in the first direction. The isolation region 13 is arranged between adjacent anti-blooming gate portions 7 to implement electric isolation between the anti-blooming gate portions 7.

The anti-blooming drain portions 9 are arranged corresponding to the respective anti-blooming gate portions 7 and adjacent in the first direction to the respective anti-blooming gate portions 7. Namely, the plurality of anti-blooming drain portions 9 are juxtaposed in the second direction on the side of the other short side forming the planar shape of the photosensitive region 3. The anti-blooming drain portions 9 are connected to a predetermined fixed potential and drain the unnecessary charges transferred from the corresponding anti-blooming gate portions 7.

The shift register portion 11 is arranged adjacent in the first direction to each transfer gate portion 5, for the plurality of transfer gate portions 5. The shift register portion 11 receives the signal charges transferred from the respective transfer gate portions 5, and transfers them in the second direction to sequentially output them to a readout amplifier portion 15. The signal charges output from the shift register portion 11 are converted to voltages by the readout amplifier portion 15 and they are output as voltages of the respective photosensitive regions 3 arranged in the second direction, to the outside of the solid-state imaging device 1.

A light-shielding film LS is arranged over the plurality of transfer gate portions 5, the plurality of anti-blooming gate portions 7, the plurality of anti-blooming drain portions 9, and the shift register portion 11, except for the plurality of photosensitive regions 3. The light-shielding film LS covers regions where the transfer gate portions 7, anti-blooming gate portions 7, anti-blooming drain portions 9, and shift register portion 11 are arranged, and prevents light from entering the foregoing regions. This can prevent generation of unnecessary charge due to light entering the regions.

The plurality of photosensitive regions 3, the plurality of transfer gate portions 5, the plurality of anti-blooming gate portions 7, the plurality of anti-blooming drain portions 9, and the shift register portion 11 are formed on a semiconductor substrate 20, as shown in FIGS. 2 and 3.

The semiconductor substrate 20 has a principal surface 20a and a principal surface 20b opposed to each other. In the present embodiment, the principal surface 20a is a light incidence surface of the semiconductor substrate 20. The semiconductor substrate 20 includes a $p^+$-type first substrate region 21 located on the principal surface 20b side and a p-type second substrate region 23 located on the principal surface 20a side. The second substrate region 23 has a lower impurity concentration than the first substrate region 21. The semiconductor substrate 20 can be obtained, for example, by growing on a p-type semiconductor substrate, a $p^-$-type epitaxial layer with a lower impurity concentration than the semiconductor substrate.

The semiconductor substrate 20 includes n-type semiconductor regions 31, $n^-$-type semiconductor regions 33, 35, $p^+$-type semiconductor regions 37, 39, and $n^+$-type semiconductor regions 41, which are provided on the principal surface 20a side. In the present embodiment, the semiconductor substrate 20 is comprised of Si. When the semiconductor substrate 20 is comprised of Si, a p-type impurity to be used is a Group 3 element such as B, and an n-type impurity to be used is a Group 5 element such as N, P, or As. The $n^-$-type semiconductor regions 33, 35 have a lower impurity concentration than the n-type semiconductor regions 31 and the $n^+$-type semiconductor regions 41 have a higher impurity concentration than the n-type semiconductor regions 31. The $p^+$-type semiconductor regions 37, 39 have a higher impurity concentration than the second substrate region 23.

The second substrate region 23 and the n-type semiconductor regions 31 form pn junctions and the n-type semiconductor regions 31 constitute the photosensitive regions 3 which generate electric charges with incidence of light. Namely, the second substrate region 23 and the n-type semiconductor regions 31 constitute embedded photodiodes. The n-type semiconductor regions 31, on a plan view, are formed in an approximately rectangular shape composed of two long sides and two short sides. The plurality of n-type semiconductor regions 31 are juxtaposed so as to be arranged along the second direction and are arranged in an array form in the one-dimensional direction. The n-type semiconductor regions 31 are juxtaposed in the direction along the short-side direction of the n-type semiconductor region 31.

For the $n^-$-type semiconductor regions 33, transfer electrodes 51, 53 are arranged. The transfer electrode 53 is arranged adjacent in the first direction to the transfer electrode 51. The transfer electrodes 51, 53 are comprised, for example, of polysilicon films and are formed through an oxide film 43 on the n-type semiconductor regions 33. The $n^-$-type semiconductor regions 33 are arranged on the side of the one short side forming the planar shape of the $n^-$-type semiconductor region 31. The oxide film 43 is comprised, for example, of a silicon oxide film.

The transfer electrodes 51, 53 are given respective transfer signals from a control circuit (not shown). The transfer electrodes 51 and the $n^-$-type semiconductor regions 33 under the transfer electrodes 51 constitute the transfer gate portions 5. The transfer electrodes 53 and the $n^-$-type semiconductor regions 33 under the transfer electrodes 53 constitute the shift register portion 11.

For the n⁻-type semiconductor regions 35, transfer electrodes 55 are arranged. The transfer electrodes 55 are comprised, for example, of polysilicon films and are formed through the oxide film 43 on the n⁻-type semiconductor regions 35. The n⁻-type semiconductor regions 35 are arranged on the side of the other short side forming the planar shape of the n-type semiconductor region 31. The transfer electrodes 55 are given respective transfer signals from the control circuit (not shown). The transfer electrodes 55 and the n⁻-type semiconductor regions 35 under the transfer electrodes 55 constitute the anti-blooming gate portions 7.

The p⁺-type semiconductor regions 37 are arranged on the sides where the long sides of the n-type semiconductor regions 31 are located. The p⁺-type semiconductor regions 37 extend in the direction along the long-side direction of the n-type semiconductor regions 31 while adjoining the n-type semiconductor regions 31. The p⁺-type semiconductor regions 37 constitute the isolation regions 13. The p⁺-type semiconductor regions 39 are arranged on the front-surface side of the n-type semiconductor regions 31. The p⁺-type semiconductor regions 39 are connected, for example, to the ground potential and are in a state in which they are filled with holes. Therefore, the p⁺-type semiconductor regions 39 suppress generation of dark current in the vicinity of the front surface (principal surface 20a) of the semiconductor substrate 20.

The p⁺-type semiconductor regions 41 are arranged adjacent to the n⁻-type semiconductor regions 35 under the transfer electrodes 55. The p⁺-type semiconductor regions 41 constitute the anti-blooming drain portions 9.

The solid-state imaging device 1, as shown in FIGS. 2 and 3, is provided with interlayer insulating films 61, 63 and a surface protecting film 65.

The interlayer insulating film 61 is arranged on the semiconductor substrate 20 so as to cover the transfer electrodes 51, 53, 55 and the oxide film 43. The interlayer insulating film 61 has a principal surface 61a and a principal surface 61b opposed to each other. The principal surface 61a of the interlayer insulating film 61 is opposed through the oxide film 43 to the principal surface 20a of the semiconductor substrate 20. Namely, the interlayer insulating film 61 is arranged on the semiconductor substrate 20 so that the principal surface 61a is opposed through the oxide film 43 to the principal surface 20a of the semiconductor substrate 20. The interlayer insulating film 61 is comprised, for example, of BPS (Boro-phospho silicate glass). The interlayer insulating film 61 also functions as an antireflection film (AR film).

Wiring lines 71 are formed in the interlayer insulating film 61. The wiring lines 71 are connected through through-holes formed in the interlayer insulating film 61 to the transfer electrodes 51, 53, 55 and the n⁺-type semiconductor regions 41.

The interlayer insulating film 63 is arranged on the interlayer insulating film 61 so as to cover the interlayer insulating film 61 and the wiring lines 71. The interlayer insulating film 63 is not formed on a region corresponding to the n-type semiconductor regions 31 (photosensitive regions 3) in the interlayer insulating film 61. Therefore, the region corresponding to the n-type semiconductor regions 31 (photosensitive regions 3) in the interlayer insulating film 61 is optically exposed. The interlayer insulating film 63 is comprised, for example, of a silicon oxide film.

The light-shielding film LS is arranged on the interlayer insulating film 63 so as to cover the interlayer insulating film 63. The light-shielding film LS is comprised, for example, of metal such as aluminum. The surface protecting film 65 is arranged on the light-shielding film LS so as to cover the light-shielding film LS. The surface protecting film 65 is comprised, for example, of a silicon nitride film.

Figure 4:
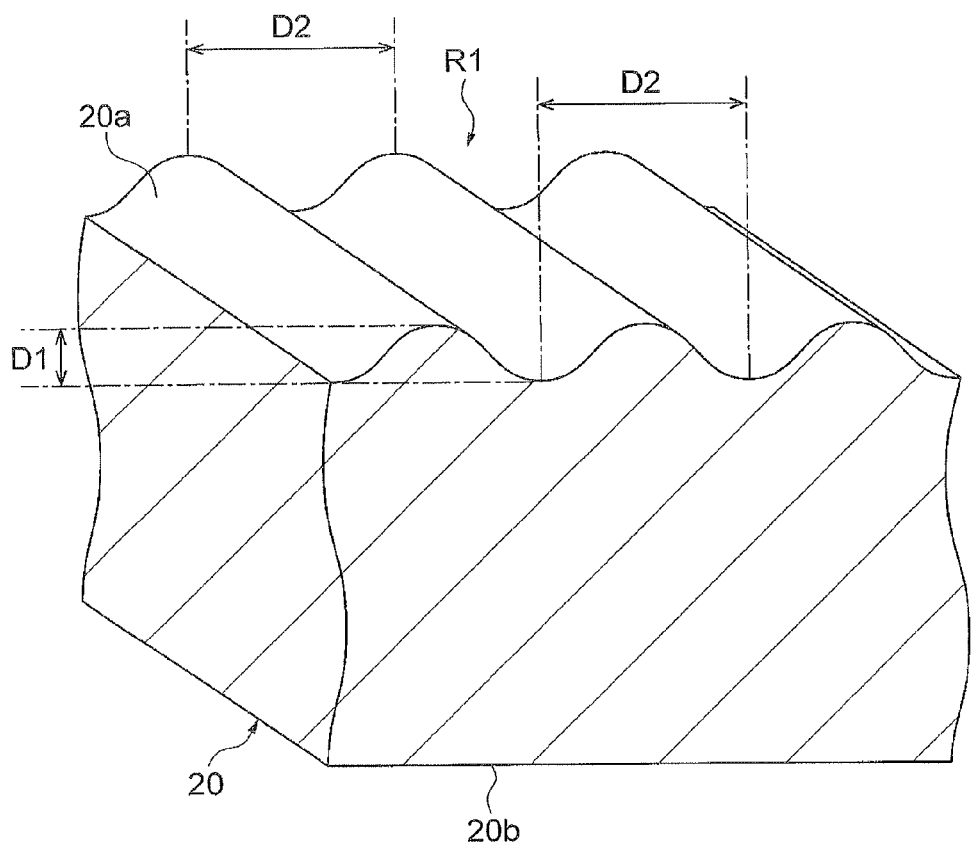
FIG. 4 is an explanatory drawing extracting and showing only a semiconductor substrate.

In the solid-state imaging device 1, as also shown in FIG. 4, a region R1 corresponding to each photosensitive region 3 in the principal surface 20a of the semiconductor substrate 20 has an uneven surface. FIG. 4 is an explanatory drawing extracting and showing only the semiconductor substrate 20. A cross section of the region R1 parallel to the thickness direction of the semiconductor substrate 20 is a corrugated shape in which concave curves and convex curves are alternately continuous. In the present embodiment, the region R1 is of the corrugated shape in a cross section parallel to the second direction (direction along the short-side direction of the photosensitive region 3) and parallel to the thickness direction. Therefore, peaks and valleys of the uneven surface extend in the first direction (direction along the long-side direction of the photosensitive region 3).

The height (depth) of the uneven surface of the region R1 continuously and periodically varies along the second direction. Namely, the uneven surface of the region R1 has no flat face. An uneven pattern of the uneven surface of the region R1 is identical in each photosensitive region 3. The term "identical" herein does not means identical in a mathematically precise sense but means substantially identical; patterns are determined to be identical if dimensional errors of shape or errors of height (depth) or the like are within ±10%. In the cross section of the uneven surface, a distance D1 between apexes of peaks and deepest points of valleys is, for example, from 0.03 to 1 μm. A distance between adjacent apexes and a distance D2 between adjacent deepest points are, for example, from 1 to 10 μm.

Figure 5:
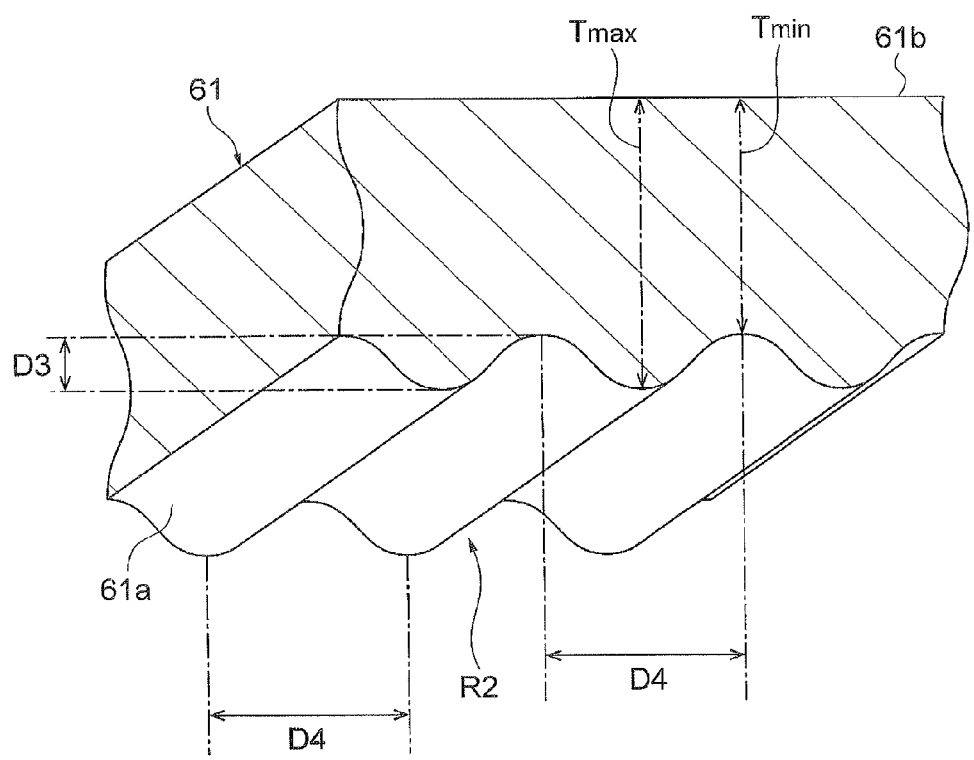
FIG. 5 is an explanatory drawing extracting and showing only an interlayer insulating film.
Figure 6:
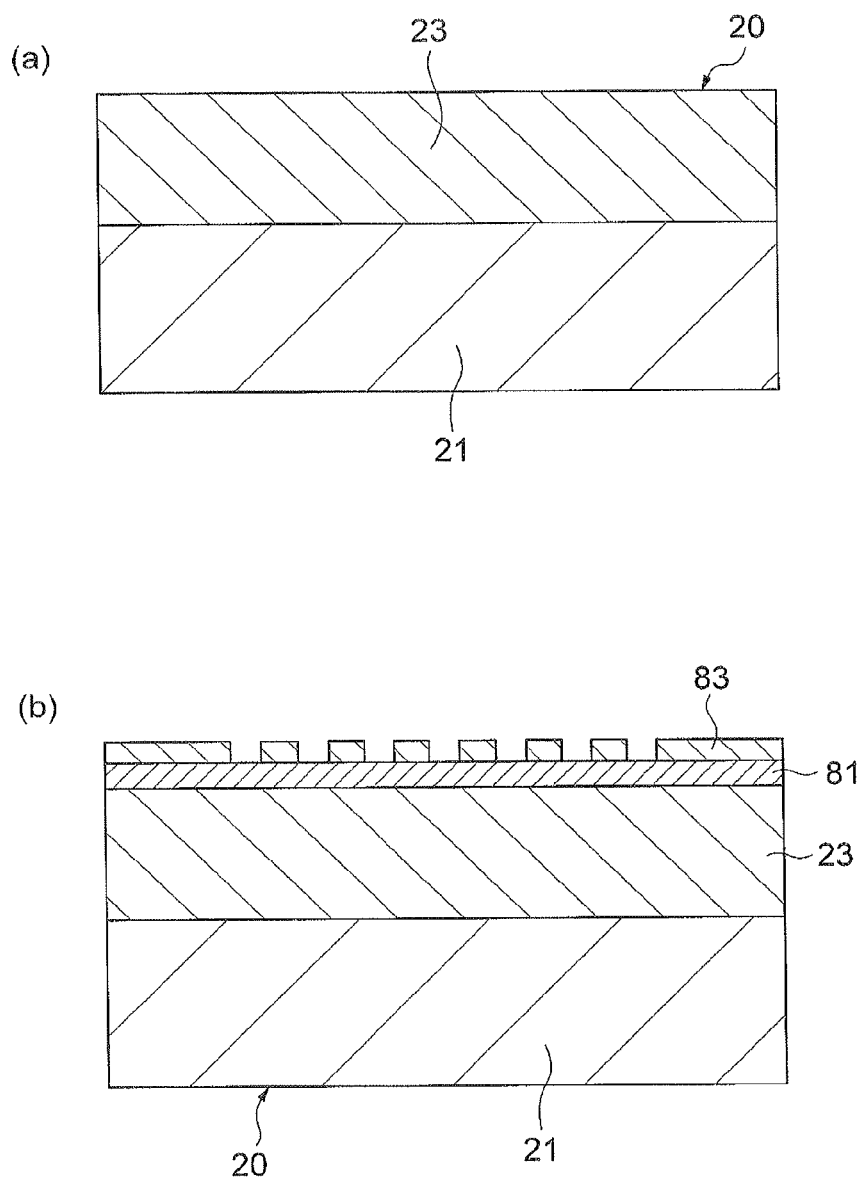
FIG. 6 is a drawing showing a manufacturing process of the solid-state imaging device according to the embodiment.
Figure 7:
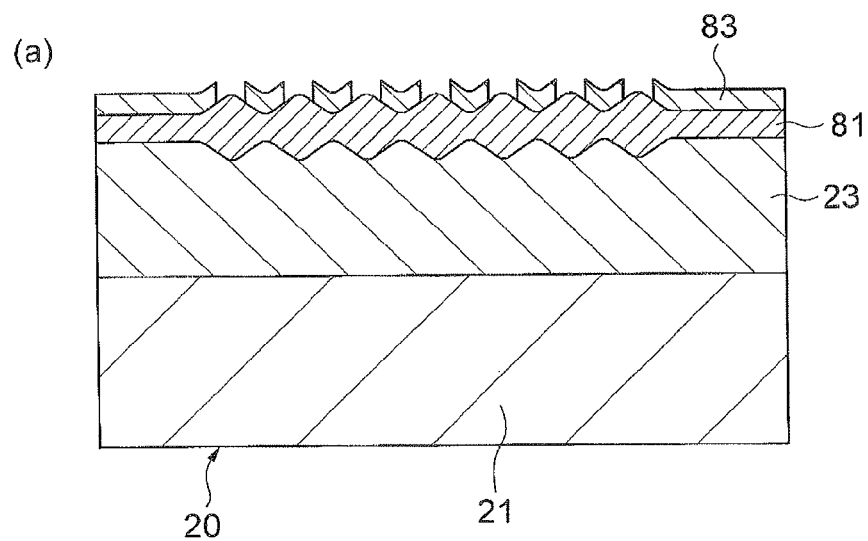
FIG. 7 is a drawing showing the manufacturing process of the solid-state imaging device according to the embodiment.
Figure 7:
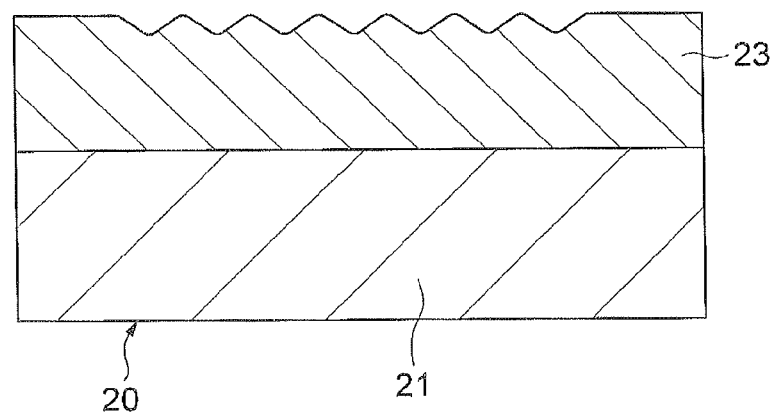
Figure 8:
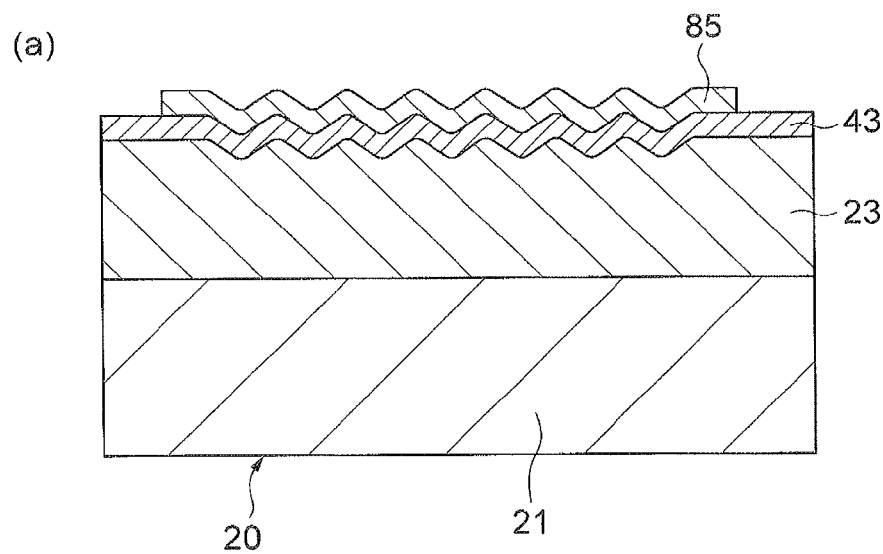
FIG. 8 is a drawing showing the manufacturing process of the solid-state imaging device according to the embodiment.
Figure 8:
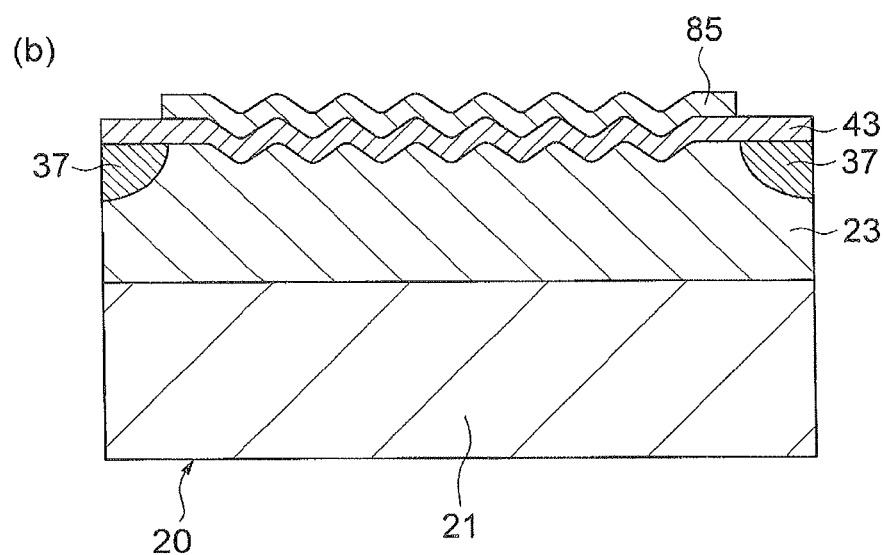
Figure 9:
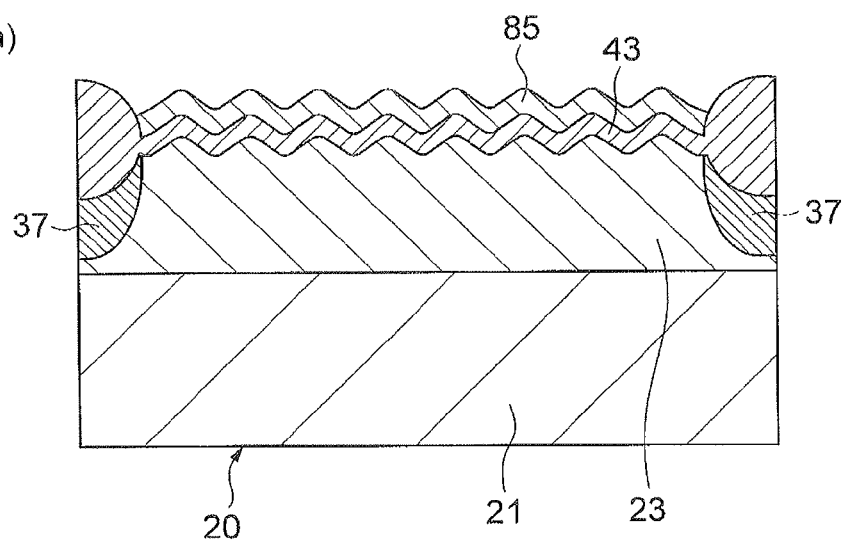
FIG. 9 is a drawing showing the manufacturing process of the solid-state imaging device according to the embodiment.
Figure 9:
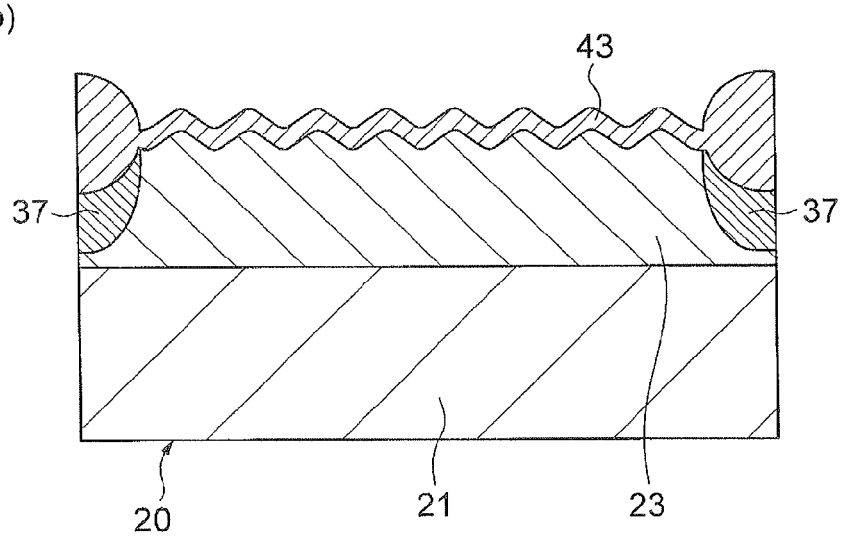
Figure 10:
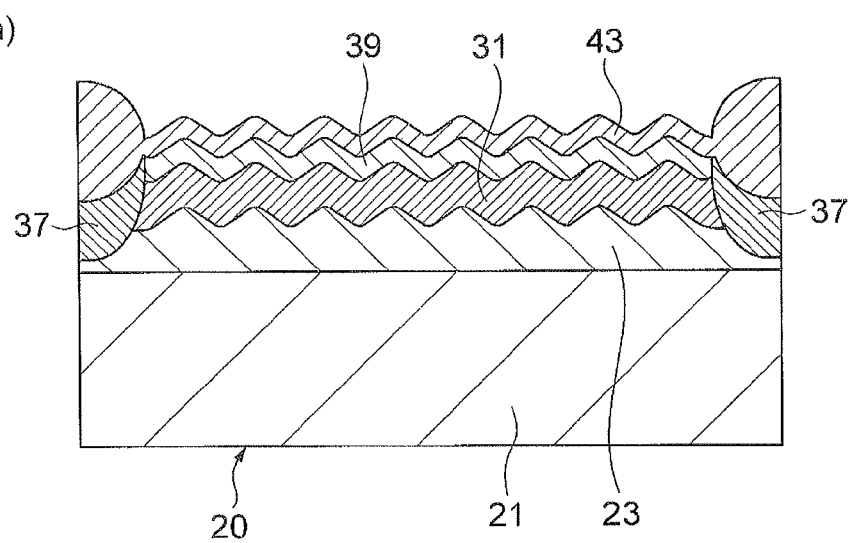
FIG. 10 is a drawing showing the manufacturing process of the solid-state imaging device according to the embodiment.
Figure 10:
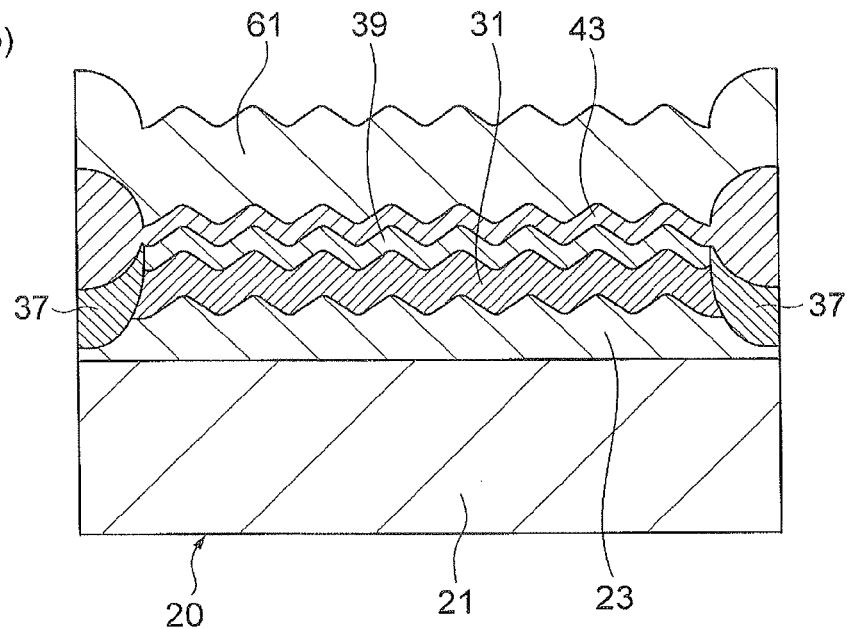
Figure 11:
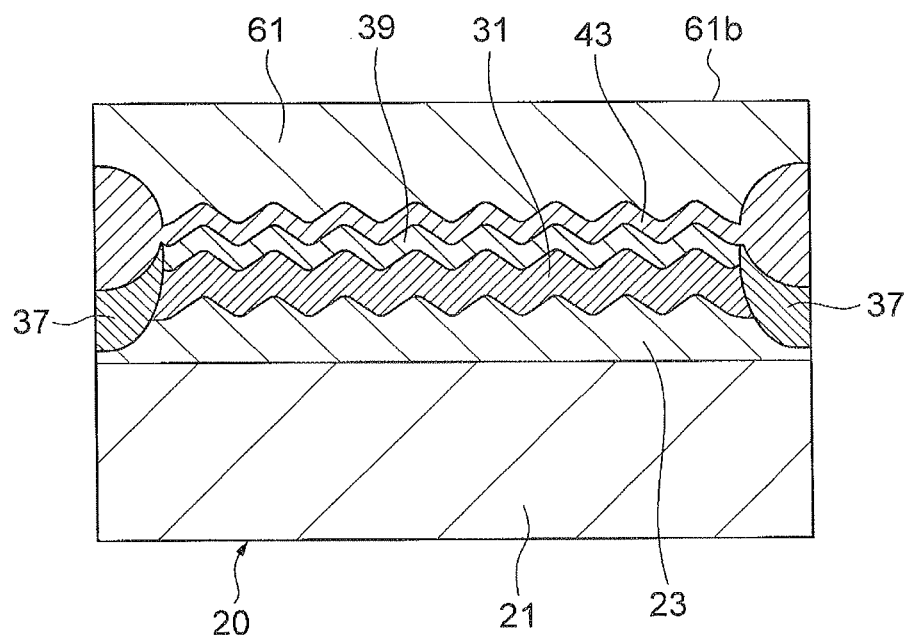
FIG. 11 is a drawing showing the manufacturing process of the solid-state imaging device according to the embodiment.

In the solid-state imaging device 1, as also shown in FIG. 5, a region R2 corresponding to each photosensitive region 3 in the principal surface 61a of the interlayer insulating film 61 also has an uneven surface. FIG. 5 is an explanatory drawing extracting and showing only the interlayer insulating film 61. A cross section of the region R2 parallel to the thickness direction of the interlayer insulating film 61 is a corrugated shape in which concave curves and convex curves are alternately continuous, corresponding to the uneven surface of the region R1. In the present embodiment, the region R2 is of the corrugated shape in the cross section parallel to the second direction and parallel to the thickness direction. Therefore, peaks and valleys of the uneven surface also extend in the first direction in the region R2.

The height (depth) of the uneven surface of the region R2 also continuously and periodically varies along the second direction as the height (depth) of the uneven surface of the region R1 does. Namely, the uneven surface of the region R2 has no flat face. An uneven pattern of the uneven surface of the region R2 is identical in each photosensitive region 3. The term "identical" herein does not means identical in a mathematically precise sense but means substantially identical; patterns are determined to be identical if dimensional errors of shape or errors of height (depth) or the like are within ±10%. In the cross section of the uneven surface, a distance D3 between apexes of peaks and deepest points of valleys is, for example, from 0.03 to 1 μm. A distance between adjacent apexes and a distance D4 between adjacent deepest points are, for example, from 1 to 10 μm.

The principal surface 61b of the interlayer insulating film 61 is flat. Therefore, the thickness of the interlayer insulating film 61 continuously and periodically varies along the second direction in the cross section parallel to the second direction and parallel to the thickness direction. A maximum thickness Tmax of the interlayer insulating film 61 is, for example, from 0.1 to 5 µm and a minimum thickness Tmin of the interlayer insulating film 61 is, for example, from 0.1 to 5 µm. An average thickness of the interlayer insulating film 61 is, for example, from 0.01 to 5 µm. A distance between the maximum thickness Tmax and the minimum thickness Tmin is the foregoing range of the distance D3.

Next, a manufacturing process of the above-described solid-state imaging device 1 will be described with reference to FIGS. 6 to 11. FIGS. 6 to 11 are drawings showing the manufacturing process of the solid-state imaging device according to the present embodiment.

First, the semiconductor substrate 20 is prepared (cf. FIG. 6(a)). Then, the surface of the semiconductor substrate 20 is thermally oxidized to form an insulating film 81 of $SiO_2$ (cf. FIG. 6(b)). Subsequently, an insulating film 83 of $SiN_x$ is formed on the insulating film 81 by the sputtering method or the like and, thereafter, the insulating film 83 is patterned so as to have a plurality of openings, using a photoresist (cf. FIG. 6(b)). This step results in exposing the insulating film 81 immediately below the openings to the outside.

Next, using the insulating film 83 as a mask, the surface of the insulating film 81 is selectively oxidized (cf. FIG. 7(a)). Oxidation does not proceed in the region where the insulting film 83 is formed, while selective oxidation proceeds in regions where the insulating film 83 is not formed (which are the regions where the openings are formed). This increases the thickness of selectively oxidized portions in the insulating film 81. Subsequently, the insulating film 81 and the insulating film 83 are removed each by etching (cf. FIG. 7(b)). As a consequence of this step, the region to become the light incidence surface (principal surface 20a) of the semiconductor substrate 20 comes to have the uneven surface.

Phosphoric acid at high temperature can be used as an etching solution for $SiN_x$ and hydrofluoric acid can be used as an etching solution for $SiO_2$. It is also possible to remove $SiN_x$ by dry etching using $CF_4$ or the like. Since $SiO_2$ is used as the base, the insulating layer 83 is removed by lift-off during wet etching of the insulating film 81 if many openings are formed in the insulating film 83 of $SiN_x$.

Next, the surface of the semiconductor substrate 20 is thermally oxidized to form the oxide film 43 (cf. FIG. 8(a)). The oxide film 43 has a corrugated shape corresponding to the uneven surface of the semiconductor substrate 20. Subsequently, an insulating film 85 is formed and patterned on a region corresponding to the uneven surface of the semiconductor substrate 20 in the insulating film 43 (cf. FIG. 8(a)). The insulating film 85 is comprised, for example, of $SiN_x$. Thereafter, the surface of the semiconductor substrate 20 is doped with a p-type impurity by the ion implantation method or diffusion method, to form the $p^+$-type semiconductor regions 37 (isolation regions 13) (cf. FIG. 8(b)).

Next, using the insulating film 85 as a mask, the oxide film 43 is selectively oxidized (cf. FIG. 9(a)). This step results in selectively growing regions exposed from the insulating film 85 in the oxide film 43. Subsequently, the insulating film 85 is removed (cf. FIG. 9(b)).

Next, through the oxide film 43, the semiconductor substrate 20 (second substrate region 23) is doped with an n-type impurity by the ion implantation method to form the r-type semiconductor regions 33, 35 (not shown) and, thereafter, the transfer electrodes 51, 53, 55 and others (not shown) are formed on the oxide film 43. Thereafter, the ion implantation method is used to implement doping with an n-type impurity to form the n-type semiconductor regions 31 and the ion implantation method is used to implement doping with a p-type impurity to form the $p^+$-type semiconductor regions 39 (cf. FIG. 10(a)). Thereafter, the interlayer insulating film 61 is formed on the transfer electrodes 51, 53, 55 and others (not shown) (cf. FIG. 10(b)). The surface in contact with the oxide film 43 in the interlayer insulating film 61 has the shape of the oxide film 43, i.e., the uneven surface corresponding to the uneven surface of the semiconductor substrate 20.

As shown in FIG. 10(b), the interlayer insulating film 61 has the front surface of an uneven surface corresponding to the uneven surface of the semiconductor substrate 20. Then, the front surface of the interlayer insulating film 61 is planarized by reflow or CMP (Chemical Mechanical Polishing) or the like (cf. FIG. 11). This step flattens the principal surface 61b of the interlayer insulating film 61. Thereafter, the wiring lines 71, interlayer insulating film 63, light-shielding film LS, and surface protecting film 65 are formed at desired positions.

The solid-state imaging device 1 is obtained through the process of these.

In the present embodiment, as described above, the principal surface 61b of the interlayer insulating film 61 is flat, whereas the principal surface 61a of the interlayer insulating film 61 has the uneven surface corresponding to the uneven surface of the region R1 in the principal surface 20a of the semiconductor substrate 20, in the region R2 corresponding to each photosensitive region 3. The uneven surface of the region R2 has the corrugated shape in which concave curves and convex curves are alternately continuous, in the cross section parallel to the thickness direction of the interlayer insulating film 61. Therefore, the thickness of the interlayer insulating film 61 varies corresponding to the shape of the uneven surface of the region R2, in the region R2. This absorbs and suppresses the influence of thickness variation in the whole of the interlayer insulating film 61, so as to enable the reduction of the variation in sensitivity and the stabilization of sensitivity.

The uneven surface of the region R1 in the principal surface 20a of the semiconductor substrate 20 is the corrugated shape in which concave curves and convex curves are alternately continuous, in the cross section parallel to the thickness direction of the semiconductor substrate 20. For this reason, the height of the uneven surface of the corrugated shape continuously varies across the whole of the region R1. Therefore, the variation in wavelength characteristic of reflectance can be reduced in a wide wavelength range.

The effect to enable the reduction of the variation in sensitivity and the stabilization of sensitivity in the solid-state imaging device 1 will be explained on the basis of the result of comparison with Comparative Example 1 . Example 1 used was the solid-state imaging device 1 of the above-described embodiment. Comparative Example 1 prepared was a solid-state imaging device in which the principal surface 20a of the semiconductor substrate 20 and the principal surface 61a of the interlayer insulating film 61 in Example 1 (cf. FIG. 3) were flat. The solid-state imaging device according to Comparative Example 1 has the same configuration as the solid-state imaging device 1, except that the principal surface 20a of the semiconductor substrate 20 and the principal surface 61a of the interlayer insulating film 61 are flat.

In the solid-state imaging device 1 used as Example 1, the maximum thickness Tmax of the interlayer insulating film 61 is set to 630 nm, the minimum thickness Tmin of the interlayer insulating film 61 to 530 nm, and the average thickness of the interlayer insulating film 61 to 580 nm. Namely, the distance D3 between apexes of peaks and deepest points of valleys in the uneven surface of the region R2 is 100 nm. In the solid-state imaging device according to Comparative Example 1, the thickness of the interlayer insulating film 61 is set to 580 nm.

Figure 12:
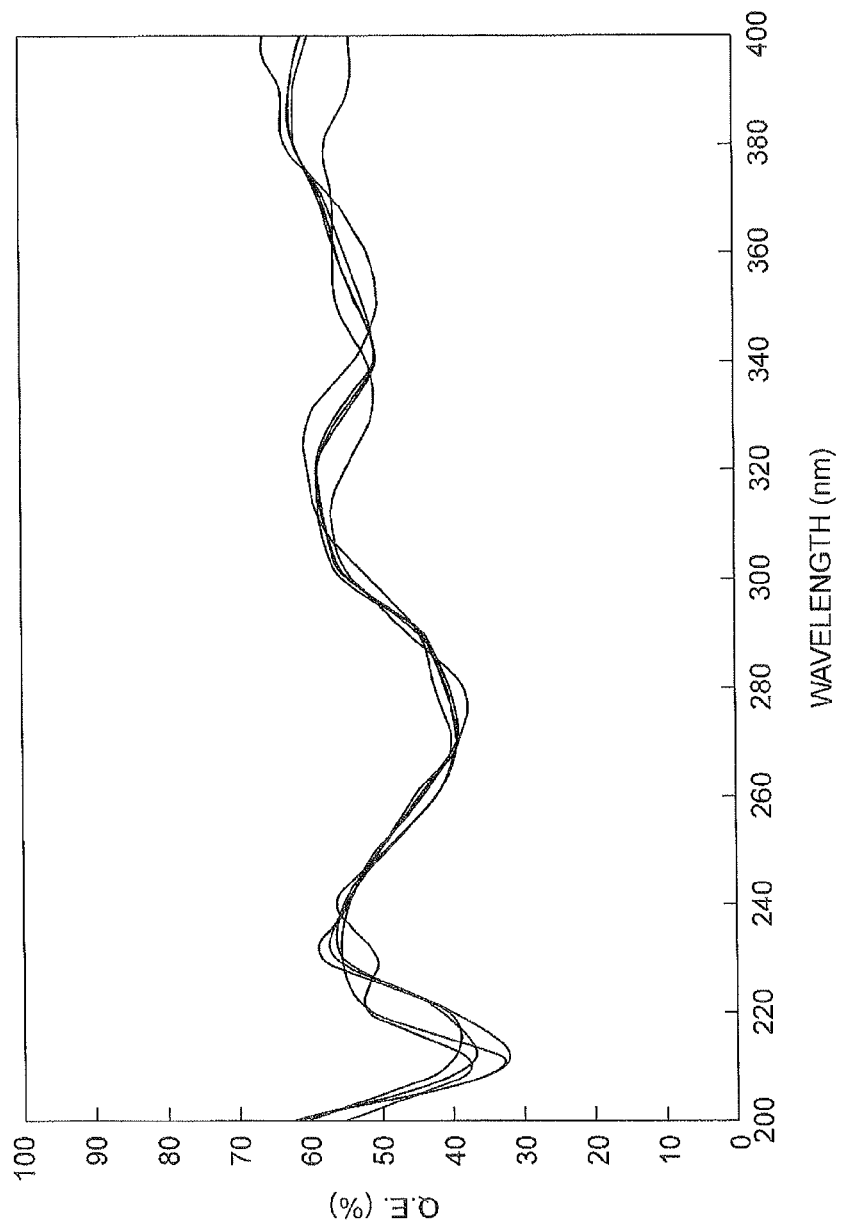
FIG. 12 is a graph showing relations between wavelength (nm) and quantum efficiency (Q.E.) (%), in Example 1.
Figure 13:
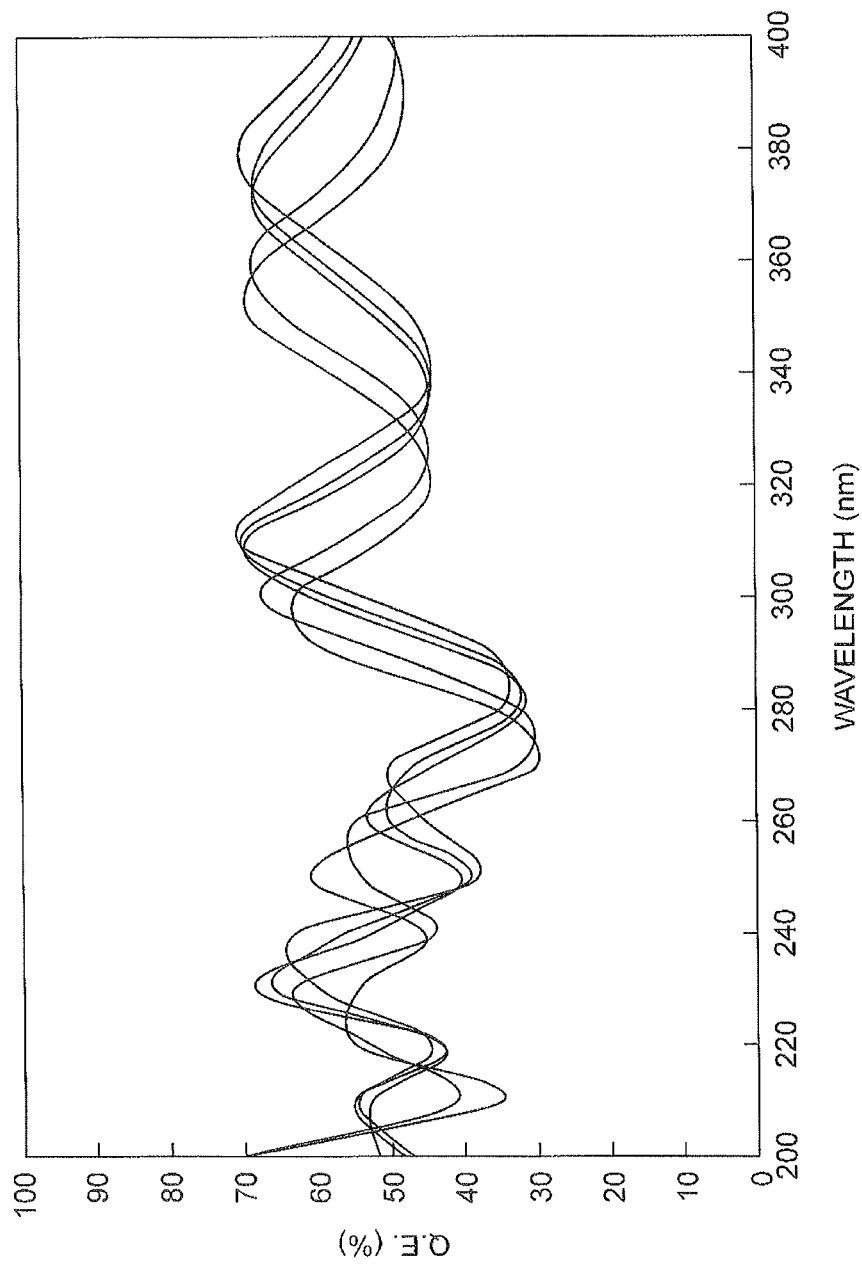
FIG. 13 is a graph showing relations between wavelength (nm) and quantum efficiency (Q.E.) (%), in Comparative Example 1.
Figure 14:
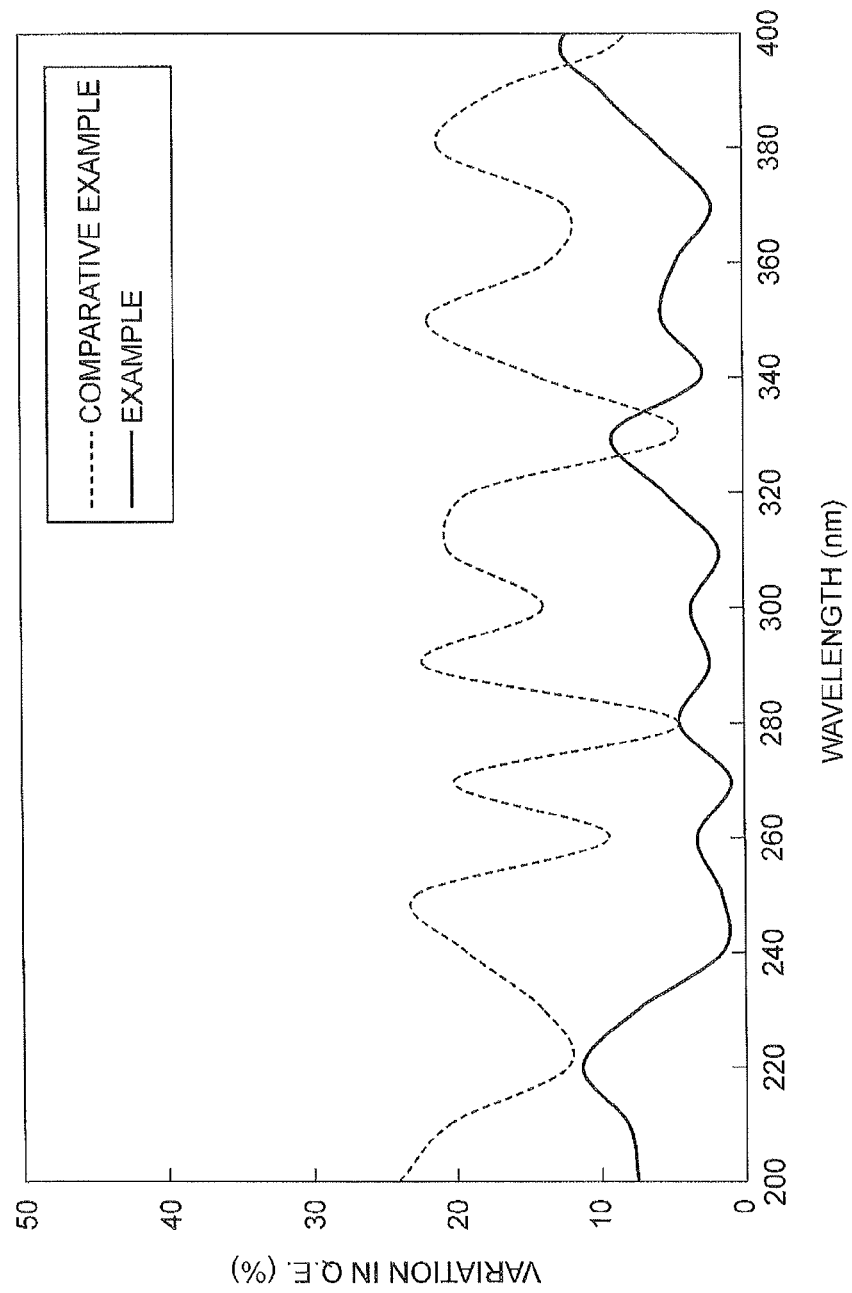
FIG. 14 is a graph showing variation in quantum efficiency at each wavelength.

The sensitivity characteristics of Example 1 and Comparative Example 1 were measured. Here, each of wavelength characteristics of quantum efficiency in a plurality of photosensitive regions at predetermined positions was measured in Example 1 and Comparative Example 1. Specifically, the wavelength characteristic of quantum efficiency was measured in each of five photosensitive regions. The measurement results are shown in FIGS. 12 to 14. FIG. 12 is a graph showing relations between wavelength (nm) and quantum efficiency (Q.E.) (%) in Example 1. FIG. 13 is a graph showing relations between wavelength (nm) and quantum efficiency (Q.E.) (%) in Comparative Example 1. FIG. 14 is a graph showing variation in quantum efficiency (difference between maximum and minimum) at each wavelength.

As seen from FIGS. 12 to 14, the variation in sensitivity is reduced in Example 1, when compared to Comparative Example 1. Specifically, the maximum of variation in sensitivity in Example 1 is 12% whereas the maximum of variation in sensitivity in Comparative Example 1 is 24%. By comparison between FIG. 12 and FIG. 13, undulation of sensitivity characteristic is less so as to achieve the stabilization of sensitivity characteristic in Example 1 than in Comparative Example 1.

Figure 15:
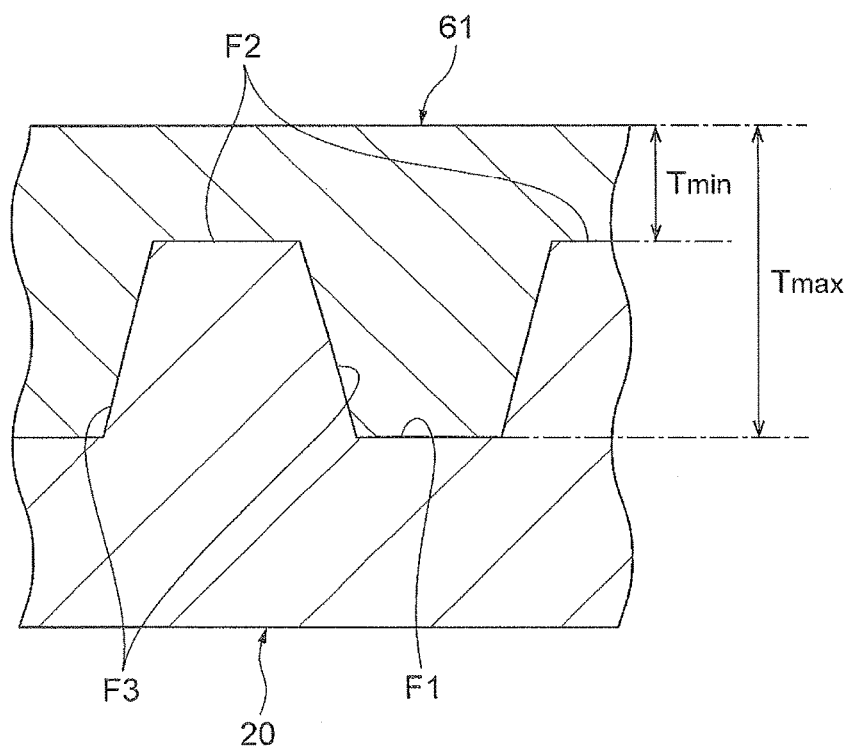
FIG. 15 is a drawing for explaining a shape of an uneven surface, in Comparative Example 3.

Next, the effect to enable the reduction of the variation in wavelength characteristic of reflectance in the solid-state imaging device 1 will be explained based on the results of comparison with Comparative Examples 2 and 3. Here, the wavelength characteristics of reflectance in Example 2 and Comparative Examples 2 and 3 were obtained by simulations. The simulation in Example 2 was conducted adopting the same configuration as the solid-state imaging device 1 of the aforementioned embodiment. The simulation in Comparative Example 2 was conducted adopting the configuration wherein the principal surface 20a of the semiconductor substrate 20 and the principal surface 61a of the interlayer insulating film 61 in Example 2 (cf. FIG. 3) were flat. The simulation in Comparative Example 3 was conducted adopting a configuration wherein the aforementioned shape of the uneven surface was different. Specifically, the configuration in Comparative Example 3 is the same as the configuration in Example 2, except that, as shown in FIG. 15, the uneven surface consists of first flat faces F1 located in deepest portions, second flat faces F2 located in top portions, and slant faces F3 connecting the first flat faces F1 and the second flat faces F2.

In Example 2 Samples 1 to 3 were adopted as simulation models and in Comparative Example 3 Samples 7 to 9 were adopted as simulation models. In Samples 1 and 7, the maximum thickness Tmax of the interlayer insulating film 61 was set to 545 nm, the minimum thickness of the interlayer insulating film 61 to 455 nm, and the average thickness of the interlayer insulating film 61 to 500 nm. In Samples 2 and 8, the maximum thickness Tmax of the interlayer insulating film 61 was set to 520 nm, the minimum thickness of the interlayer insulating film 61 to 430 nm, and the average thickness of the interlayer insulating film 61 to 475 nm. In Samples 3 and 9, the maximum thickness Tmax of the interlayer insulating film 61 was set to 570 nm, the minimum thickness of the interlayer insulating film 61 to 480 nm, and the average thickness of the interlayer insulating film 61 to 525 nm. In Samples 1-3 and 7-9, the average thickness of the interlayer insulating film 61 has variation in the range of 500 nm±25 nm (5% of the average thickness of the interlayer insulating film 61). In Samples 1-3 and 7-9, the distance between apexes of peaks and deepest points of valleys in the uneven surface is 90 nm.

In Comparative Example 2, Samples 4 to 6 were adopted as simulation models. In Sample 4, the thickness of the interlayer insulating film 61 is set to 500 nm. In Sample 5, the thickness of the interlayer insulating film 61 is set to 475 nm. In Sample 6, the thickness of the interlayer insulating film 61 is set to 525 nm. Namely, in Samples 4-6, the thickness of the interlayer insulating film 61 has variation in the range of 500 nm±25 nm (5% of the thickness of the interlayer insulating film 61).

Figure 16:
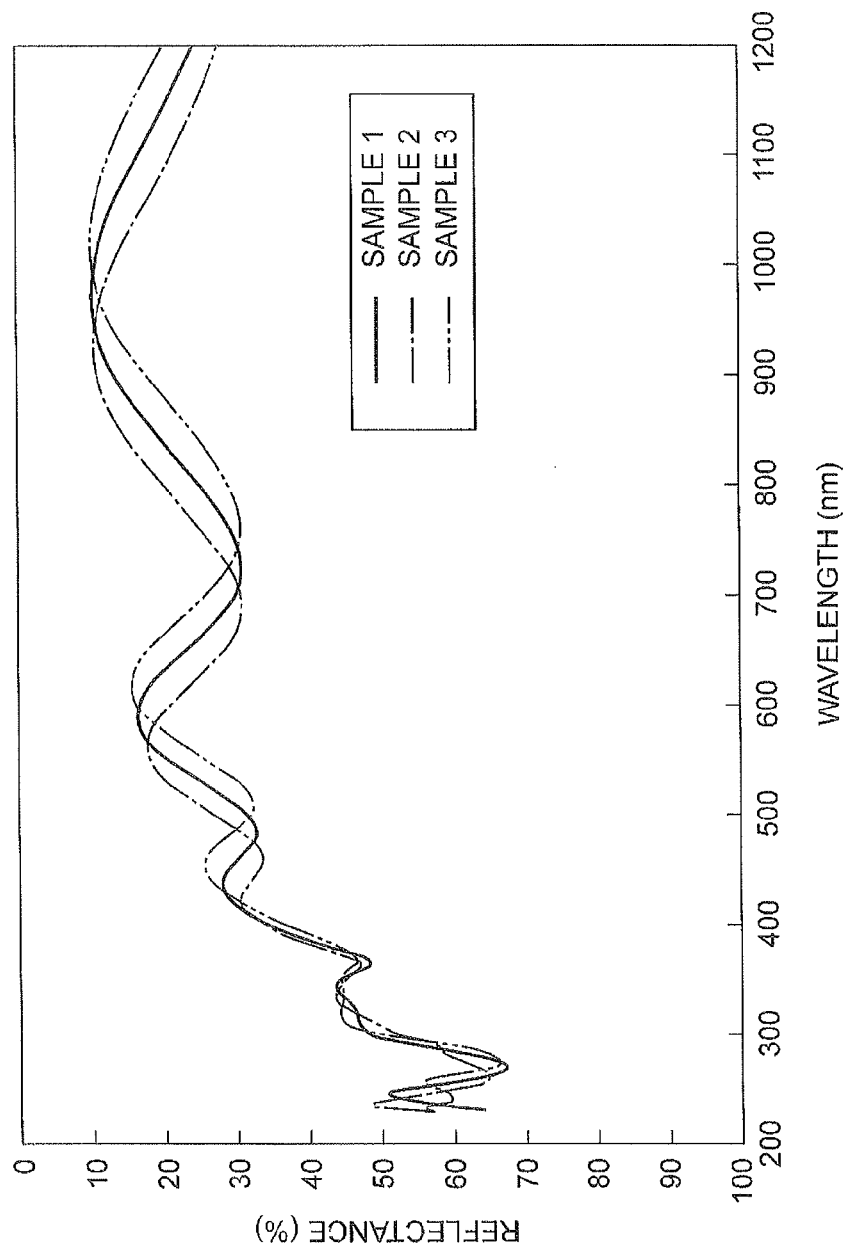
FIG. 16 is a graph showing relations between wavelength (nm) and reflectance (%), in respective Samples 1 to 3 in Example 2.
Figure 17:
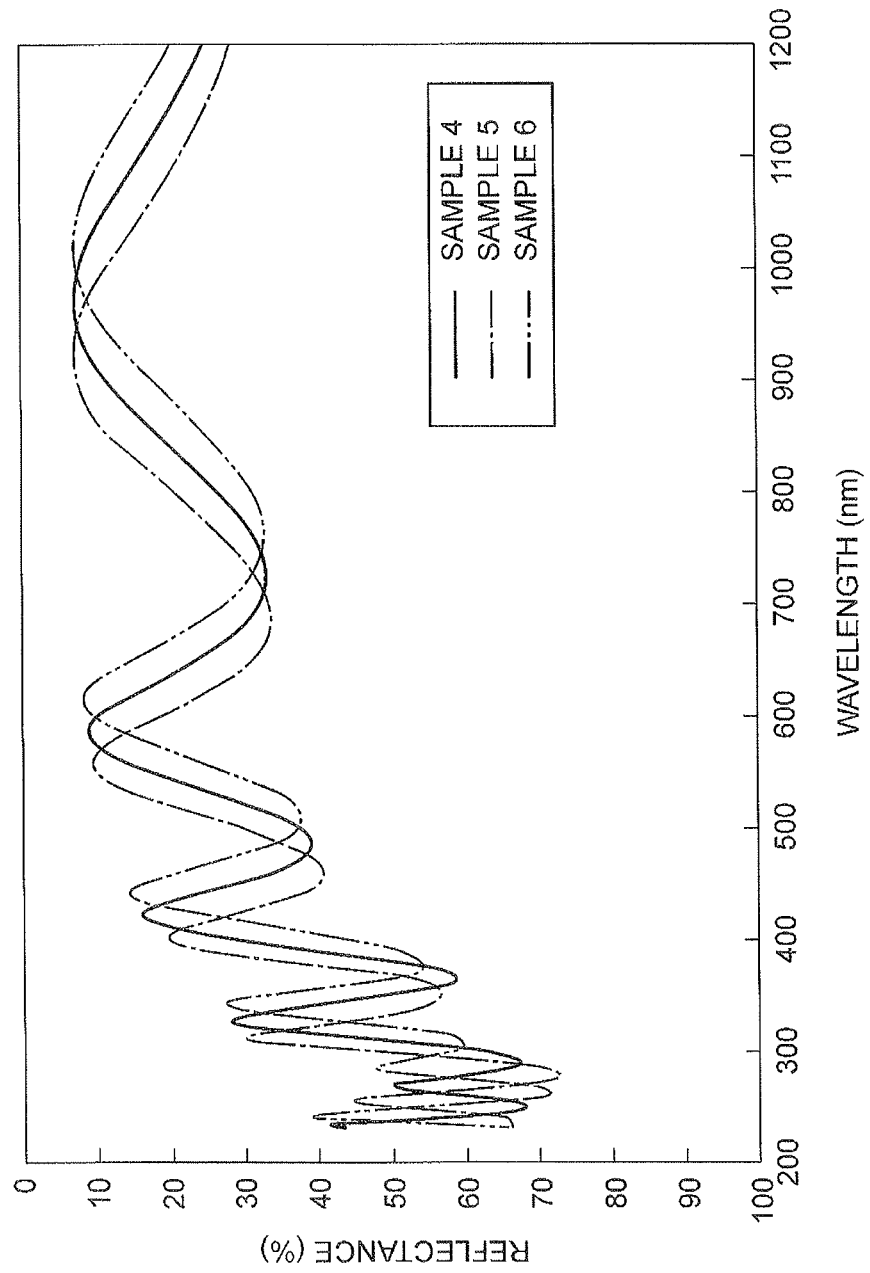
FIG. 17 is a graph showing relations between wavelength (nm) and reflectance (%), in respective Samples 4 to 6 in Comparative Example 2.
Figure 18:
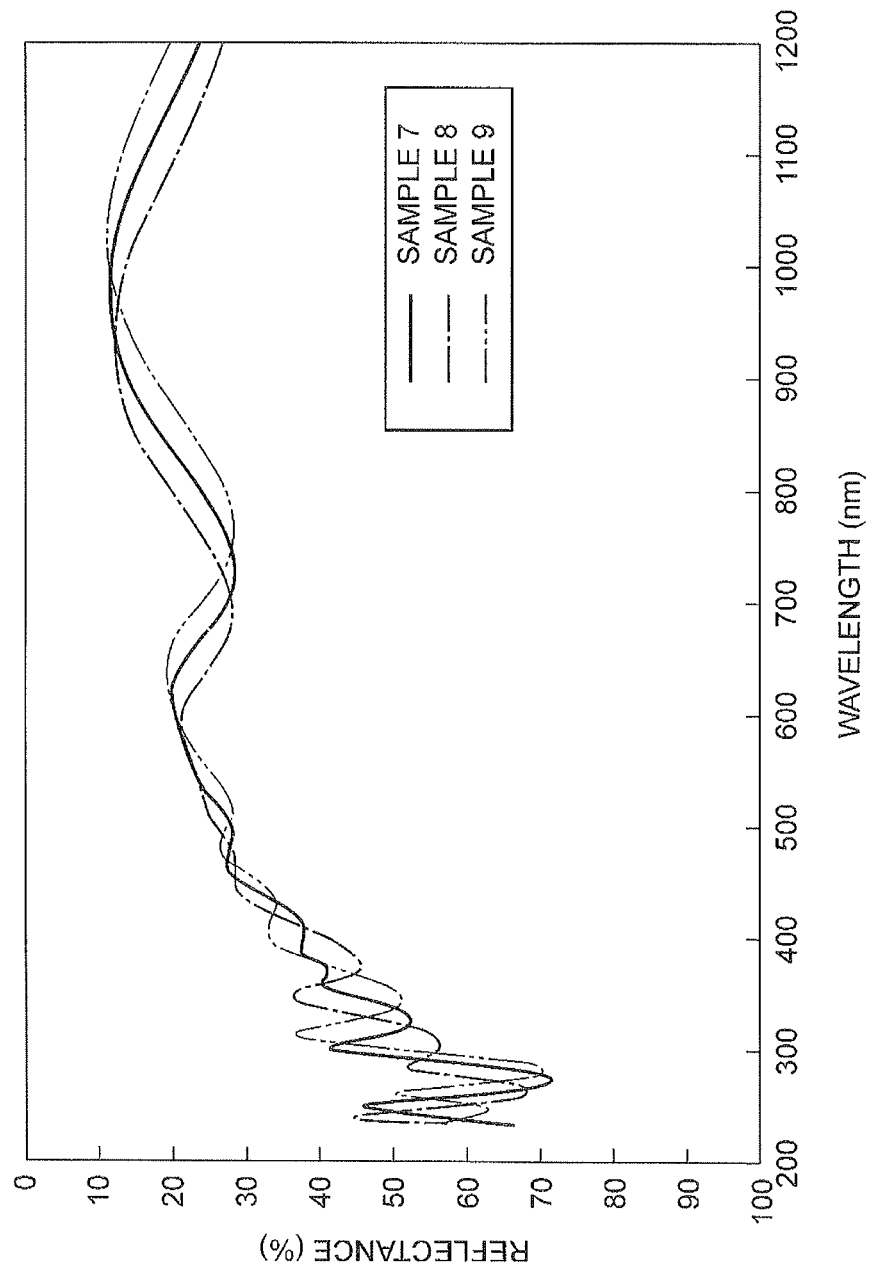
FIG. 18 is a graph showing relations between wavelength (nm) and reflectance (%), in respective Samples 7 to 9 in Comparative Example 3.
Figure 19:
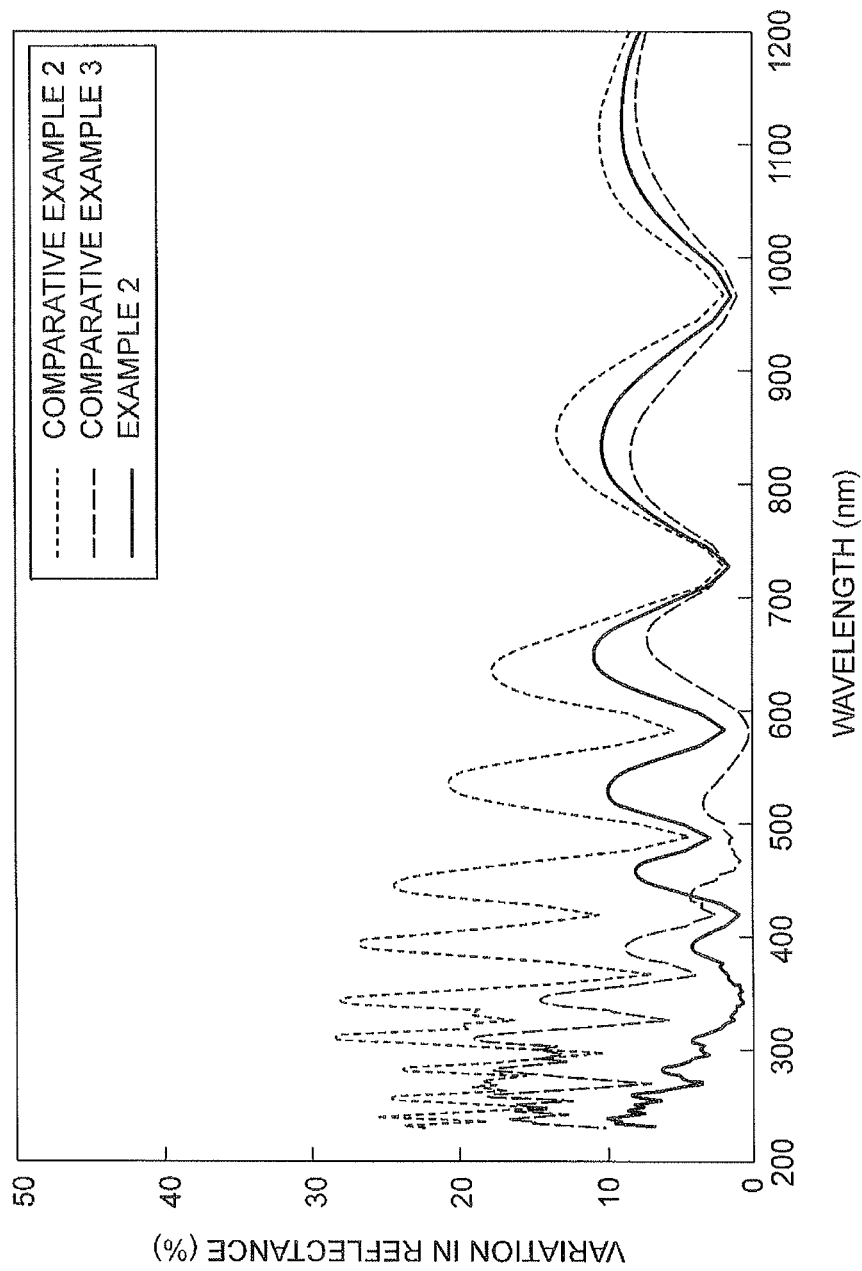
FIG. 19 is a graph showing variation in reflectance (difference between maximum and minimum) at each wavelength.

The simulation results are shown in FIGS. 16 to 19. FIG. 16 is a graph showing relations between wavelength (nm) and reflectance (%) in respective Samples 1-3 in Example 2. FIG. 17 is a graph showing relations between wavelength (nm) and reflectance (%) in respective Samples 4-6 in Comparative Example 2. FIG. 18 is a graph showing relations between wavelength (nm) and reflectance (%) in respective Samples 7-9 in Comparative Example 3. FIG. 19 is a graph showing variation in reflectance (difference between maximum and minimum) at each wavelength.

As seen from FIGS. 16 to 19, the variation in wavelength characteristic of reflectance is reduced in Example 2, when compared to Comparative Examples 2 and 3. Specifically, the maximum of variation in reflectance in Example 2 is 11%, whereas the maximum of variation in reflectance in Comparative Example 2 is 28% and that in Comparative Example 3 is 19%.

The preferred embodiment of the present invention was described above, but it should be noted that the present invention is not always limited to the above-described embodiment and can be modified in many ways without departing from the gist of the invention.

Figure 20:
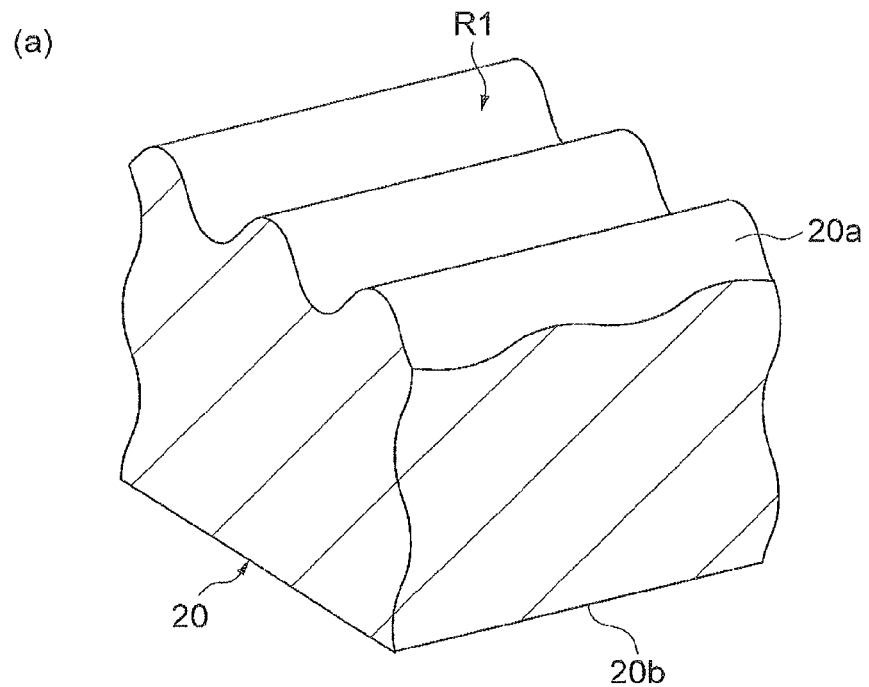
FIG. 20 is a drawing for explaining a solid-state imaging device according to a modification example of the embodiment.
Figure 20:
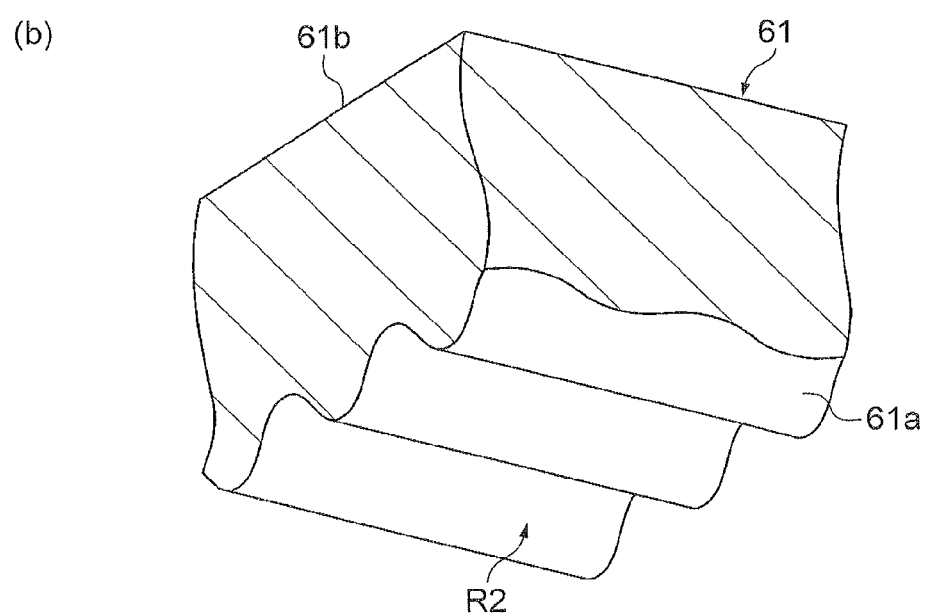
Figure 21:
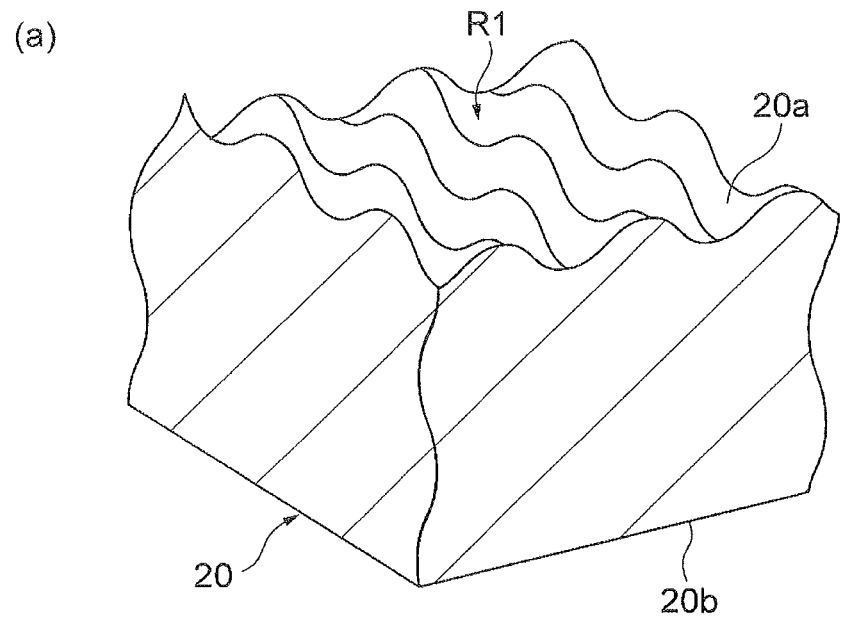
FIG. 21 is a drawing for explaining a solid-state imaging device according to another modification example of the embodiment.
Figure 21:
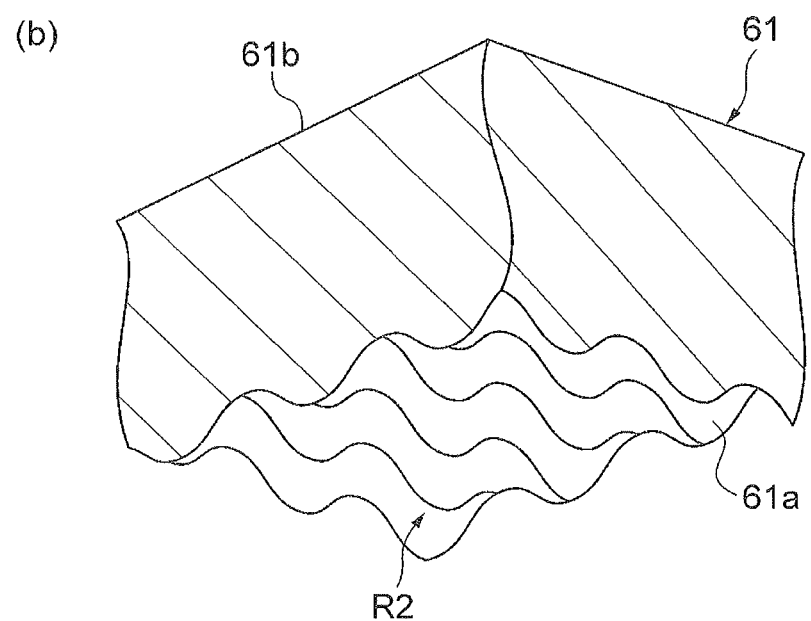

The shapes of the uneven surfaces of the region R1 and the region R2 are not limited to the aforementioned shapes. As shown in FIG. 20, the uneven surfaces of the region R1 and the region R2 may be corrugated shapes in a cross section parallel to the first direction (direction along the long-side direction of the photosensitive region 3) and parallel to the thickness direction. As shown in FIG. 21, the uneven surfaces of the region R1 and the region R2 may be corrugated shapes in the cross section parallel to the first direction and parallel to the thickness direction and in the cross section parallel to the second direction and parallel to the thickness direction. FIGS. 20 and 21 are drawings for explaining the solid-state imaging device s according to modification examples of the embodiment, wherein each (a) is an explanatory drawing extracting and showing only the semiconductor substrate and each (b) an explanatory drawing s extracting and showing only the interlayer insulating film.

The conductivity types of p-type and n-type may be switched to the opposite types to those described above, The present invention is also applicable to image sensors with photodiodes as light receiving portions, such as CMOS image sensors.

INDUSTRIAL APPLICABILITY

The present invention can be applied to the solid-state imaging devices such as CCD image sensors or CMOS image sensors.

REFERENCE SIGNS LIST

1 solid-state imaging device; 3 photosensitive regions; 20 semiconductor substrate; 20a, 20b principal surfaces; 31 n-type semiconductor regions; 43 oxide film; 61 interlayer insulating film; 61a, 61b principal surfaces.

The invention claimed is:

1. A solid-state imaging device comprising:
 a semiconductor substrate having a first principal surface and a second principal surface opposed to each other, and provided with a plurality of photosensitive regions on the first principal surface side, the first principle surface being a light incident surface of the semiconductor substrate; and
 an antireflection film having a third principal surface and a fourth principal surface opposed to each other, and arranged on the semiconductor substrate so that the third principal surface is opposed to the first principal surface, the fourth principle surface being a light incident surface of the antireflection film,
 wherein a cross section parallel to a thickness direction of the semiconductor substrate, of a region corresponding to each said photosensitive region in the first principal surface of the semiconductor substrate is a corrugated shape in which concave curves and convex curves are alternately continuous,
 wherein a cross section parallel to a thickness direction of the antireflection film, of a region corresponding to each said photosensitive region in the third principal surface of the antireflection film is a corrugated shape in which concave curves and convex curves are alternately continuous corresponding to the first principal surface,
 wherein the fourth principal surface of the antireflection film is flat,
 wherein the solid-state imaging device is a front-illuminated type, and
 the semiconductor substrate includes a substrate region of a first conductivity type and a plurality of semiconductor regions of a second conductivity type, each constituting the corresponding photosensitive region; and
 a cross section parallel to a thickness direction of the semiconductor substrate, of pn junction planes between the substrate region and the semiconductor regions are corrugated shapes in which concave curves and convex curves are alternately continuous corresponding to the first principal surface.

2. The solid-state imaging device according to claim 1, wherein the antireflection film is arranged through an oxide film on the semiconductor substrate.

3. The solid-state imaging device according to claim 2, wherein on the semiconductor substrate, a plurality of semiconductor regions having a conductivity type different from that of the semiconductor substrate are arranged on the first principal surface side, and
 wherein each said photosensitive region is comprised of a pn junction formed of the semiconductor substrate and the semiconductor region.

4. The solid-state imaging device according to claim 1, wherein on the semiconductor substrate, a plurality of semiconductor regions having a conductivity type different from that of the semiconductor substrate are arranged on the first principal surface side, and
 wherein each said photosensitive region is comprised of a pn junction formed of the semiconductor substrate and the semiconductor region.

* * * * *